United States Patent
You

(10) Patent No.: US 9,654,084 B2
(45) Date of Patent: May 16, 2017

(54) CAPACITOR FOR SAW FILTER, SAW FILTER AND METHOD OF MANUFACTURING THEREOF

(71) Applicant: WISOL CO., LTD., Osan-si, Gyeonggi-do (KR)

(72) Inventor: Dong Jun You, Suwon-si (KR)

(73) Assignee: WISOL CO., LTD., Osan-si, Gyeonggi-Do (KR)

( * ) Notice: Subject to any disclaimer, the term of this patent is extended or adjusted under 35 U.S.C. 154(b) by 88 days.

(21) Appl. No.: 14/601,538

(22) Filed: Jan. 21, 2015

(65) Prior Publication Data

US 2016/0141107 A1 May 19, 2016

(30) Foreign Application Priority Data

Nov. 13, 2014 (KR) .................. 10-2014-0158049

(51) Int. Cl.
*H03H 9/64* (2006.01)
*H03H 3/08* (2006.01)
(Continued)

(52) U.S. Cl.
CPC .............. *H03H 9/64* (2013.01); *H01G 2/02* (2013.01); *H01G 4/40* (2013.01); *H03H 3/08* (2013.01);
(Continued)

(58) Field of Classification Search
CPC ........ H03H 9/542; H03H 9/64; H03H 9/6423; H03H 9/6479; H03H 9/6483; H03H 3/10; H03H 9/02992; H01G 2/02; H01G 4/40
(Continued)

(56) References Cited

U.S. PATENT DOCUMENTS 4,700,457 A * 10/1987 Matsukawa ....... H01L 27/10805
148/DIG. 14
5,215,546 A * 6/1993 Cho ...................... H03H 3/08
29/25.01
(Continued)

FOREIGN PATENT DOCUMENTS

JP 56-037721 A * 4/1981
JP 02-177712 A * 7/1990
(Continued)

OTHER PUBLICATIONS

English language machine translation of JP 11-041055, published Feb. 12, 1999, 3 pages.*
(Continued)

*Primary Examiner* — Barbara Summons
(74) *Attorney, Agent, or Firm* — LRK Patent Law Firm

(57) ABSTRACT

The present invention relates to a capacitor for a SAW filter, the SAW filter, and a method of manufacturing thereof, and more specifically, to a capacitor for a SAW filter including a first metal layer formed on a substrate; an insulation layer formed on the first metal layer; and a second metal layer formed on the insulation layer and overlapped with partially or totally of the first metal layer, in which the insulation layer is formed to be extended to the top of an IDT formed on the substrate, the SAW filter on which such a capacitor for a SAW filter is mounted, and a method of manufacturing thereof.

6 Claims, 3 Drawing Sheets

(51) Int. Cl.
*H03H 3/10* (2006.01)
*H01G 4/40* (2006.01)
*H01G 2/02* (2006.01)
*H03H 9/02* (2006.01)

(52) U.S. Cl.
CPC .......... *H03H 3/10* (2013.01); *H03H 9/02992* (2013.01); *H03H 9/6479* (2013.01)

(58) Field of Classification Search
USPC .................................................. 333/193–196
See application file for complete search history.

(56) References Cited

U.S. PATENT DOCUMENTS

| | | | | |
|---|---|---|---|---|
| 6,404,303 | B1 * | 6/2002 | Kuroda | H03H 9/0542 333/193 |
| 8,587,921 | B2 * | 11/2013 | Bar | H01G 4/228 361/303 |
| 2007/0107177 | A1 | 5/2007 | Kawachi et al. | |
| 2011/0063046 | A1 * | 3/2011 | Fujiwara | H03H 9/0071 333/133 |
| 2011/0080234 | A1 * | 4/2011 | Haruta | H03H 9/059 333/193 |

FOREIGN PATENT DOCUMENTS

| | | | |
|---|---|---|---|
| JP | 04-168762 | A | 6/1992 |
| JP | 06-244235 | A | 9/1994 |
| JP | 08-065089 | A * | 3/1996 |
| JP | 08-250659 | A * | 9/1996 |
| JP | 08-306862 | A | 11/1996 |
| JP | 09-153758 | A * | 6/1997 |
| JP | 11-041055 | A | 2/1999 |
| JP | 11-330904 | A | 11/1999 |
| JP | 2001-016066 | A * | 1/2001 |
| JP | 2001-189421 | A | 7/2001 |
| JP | 2002-299997 | A | 10/2002 |
| JP | 3401408 | B2 | 4/2003 |
| JP | 2005-278131 | A | 10/2005 |
| JP | 2010-512077 | A | 4/2010 |
| KR | 10-2010-0131964 | A | 12/2010 |
| WO | 2009/096563 | A1 | 8/2009 |

OTHER PUBLICATIONS

English language machine translation of JP 08-250659, published Sep. 27, 1996, 5 pages.*
English language machine translation of JP 08-065089, published Mar. 8, 1996, 7 pages.*
English language machine translation of JP 02-177712, published Jul. 10, 1990, 3 pages.*
English language machine translation of JP 56-037721, published Apr. 11, 1981, 3 pages.*
JPO Office Action, dated Sep. 1, 2015, for Japanese Patent Application No. 2015-011588.
KIPO Office Action, dated Nov. 18, 2015, for Korean Patent Application No. 10-2014-0158049.

* cited by examiner

FIG.1A                    FIG. 1B
RELATED ART
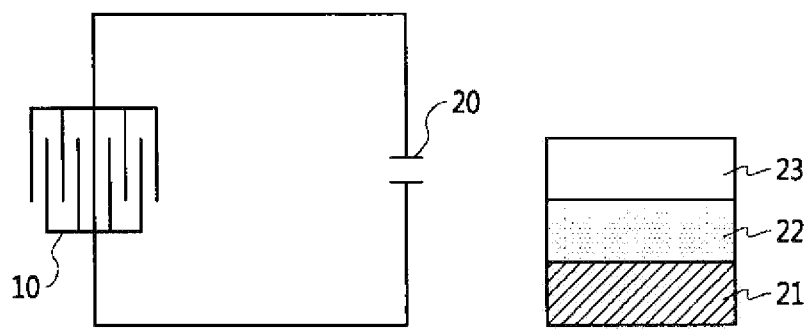
FIG.2A                    FIG.2B
RELATED ART
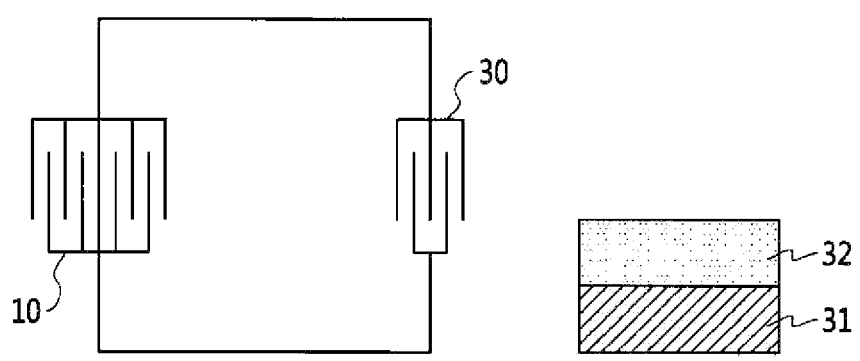

FIG. 3A
FIG. 3B
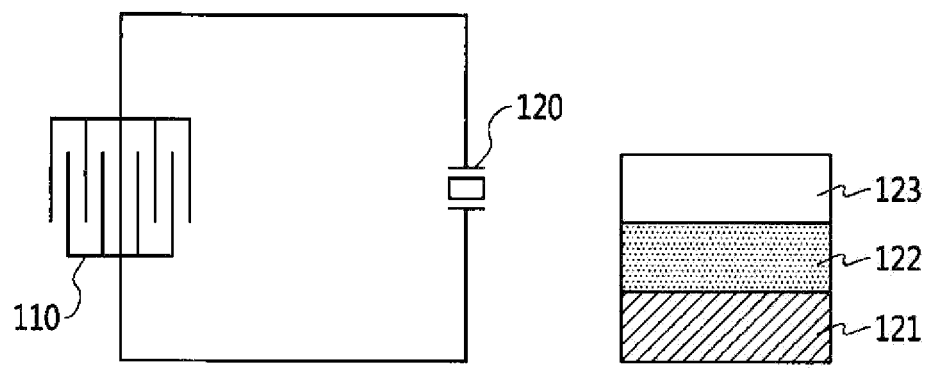
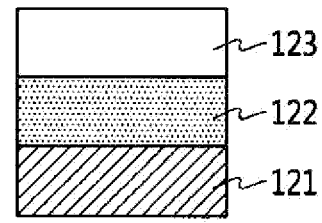
FIG. 4
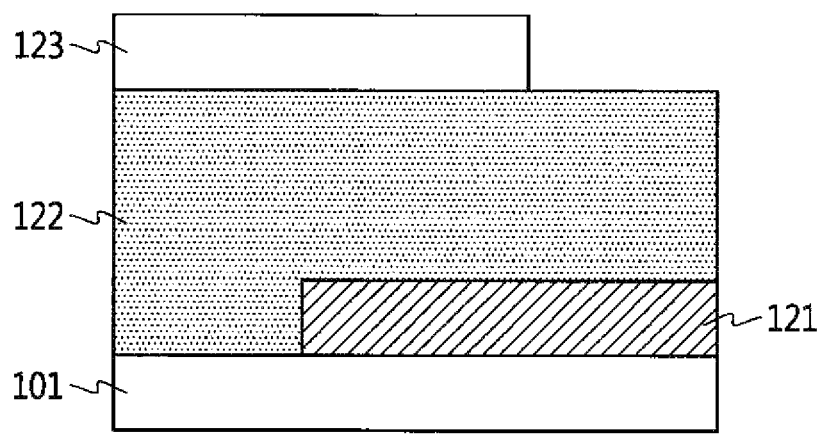

CAPACITOR FOR SAW FILTER, SAW FILTER AND METHOD OF MANUFACTURING THEREOF

BACKGROUND OF THE INVENTION

Field of the Invention

The present invention relates to a capacitor mounted on a surface acoustic wave (SAW) filter, the SAW filter including the capacitor, and a method of manufacturing thereof.

Background of the Related Art

A surface acoustic wave (SAW) filter is a device for transferring signals using surface acoustic waves having physical characteristics, not electromagnetic waves, and removing unnecessary signals in the process of transferring the signals. The SAW filter is used for video signal processing or audio signal processing of a TV, a VTR or the like, and as mobile communication is advanced recently, it is widely used for mobile communication terminals. SAW duplexing of dielectric duplexers is under progress according to miniaturization and lightweightness of the mobile communication terminals, and miniaturization of the SAW filter using a flip-chip process is under progress.

On the other hand, a capacitor is an important device for storing information in DRAM or embedded DRAM, which are memory elements, an RF ID element which is a logic element, or the like. In the memory element, the capacitor stores electric charge of a predetermined amount or more inside thereof to distinguish 0 and 1 to make operation of a desired device possible. In the semiconductor industry, it is very important to develop a technique of manufacturing an ultrahigh density element integrated under a 50 nano size to simultaneously implement cost reduction, low power consumption and miniaturization of a chip, and to this end, a technique of allowing a capacitor, which stores data, to have a capacitance sufficient for operating a device is more important than any other techniques.

FIG. 1A is a plan view schematically showing an Inter-Digital Transducer (IDT) and a capacitor applied to a SAW filter of the prior art, and FIG. 1B is a cross-sectional view schematically showing a capacitor applied to a SAW filter of the prior art. Referring to FIGS. 1A and 1B, in a SAW filter, an upper electrode 23 and a lower electrode 21 is generally formed of poly-crystal silicon (poly-Si), and a capacitor 20 having a dielectric substance 22 formed between the upper electrode 23 and the lower electrode 21 is applied. However, since it is difficult to obtain a desired capacitance of a cell as the area of the cell decreases, a capacitor 20 replacing the upper electrode 23 with a metallic electrode of TiN or the like to prevent a low dielectric layer from being formed between the upper electrode 23 and the dielectric substance 22 and applying a dielectric film such as Al3O3, Ta2O5 or the like to have a dielectric substance 22 of high permittivity is commercialized and applied.

FIG. 2A is a plan view schematically showing an IDT and another capacitor applied to a SAW filter of the prior art, and FIG. 2B is a cross-sectional view schematically showing another capacitor applied to a SAW filter of the prior art. Referring to FIGS. 2A and 2B, an IDT capacitor 30 is applied to a SAW filter in which an IDT 10 is formed. The IDT capacitor 30 is formed by stacking a first metal layer 32 formed by using a metal the same as that of an electrode 10 on a substrate 31.

However, there is a problem in that the duplexer SAW filter applied with such conventional capacitors 20 and 30 of the prior art cannot have an ideal low cut-off characteristic.

SUMMARY OF THE INVENTION

Accordingly, the present invention has been made in view of the above-mentioned problems occurring in the prior art, and it is an object of the present invention to improve the low cut-off characteristic of a SAW element.

It is another object of the present invention to implement a capacitor improving the low cut-off characteristic without adding another process to existing processes.

To accomplish the above objects, according to an aspect of the present invention, there is provided a capacitor for a SAW filter, the capacitor including: a first metal layer formed on a substrate; an insulation layer formed on the first metal layer; and a second metal layer formed on the insulation layer and overlapped with partially or totally of the first metal layer, in which the insulation layer is formed to be extended to the top of an IDT formed on the substrate.

The first metal layer may be formed of a material the same as that of the IDT, and, for example, the first metal layer may be formed of copper (Cu). On the other hand, the second metal layer may be formed of a material different from that of the first metal layer, and, for example, the second metal layer may be formed of aluminum (Al) or gold (Au).

To accomplish the above objects, according to another aspect of the present invention, there is provided a SAW filter including: an IDT formed on a substrate; a first metal layer formed on the substrate; an insulation layer formed on the IDT and the first metal layer; and a second metal layer formed on the insulation layer and overlapped with partially or totally of the first metal layer. On the other hand, the SAW filter may further include a pad for connecting the IDT to outside, and the pad is formed on the insulation layer not to be overlapped with the second metal layer. In an embodiment of the present invention, the second metal layer may be formed of a material the same as that of the pad.

To accomplish the above objects, according to another aspect of the present invention, there is provided a method of manufacturing a SAW filter, the method including the steps of: forming an IDT and a first metal layer of a capacitor on a substrate; forming an insulation layer on the IDT and the first metal layer; and forming a pad and a second metal layer on the insulation layer, in which the second metal layer may be formed to be overlapped with partially or totally of the first metal layer. At this point, the IDT and the first metal layer may be formed of a same metallic material, and, for example, the IDT and the first metal layer may be formed of copper (Cu).

On the other hand, the pad and the second metal layer may be formed of a same metallic material, and the metallic material forming the pad and the second metal layer may be different from the metallic material forming the IDT and the first metal layer. For example, the pad and the second metal layer may be formed of aluminum (Al) or gold (Au).

BRIEF DESCRIPTION OF THE DRAWINGS

FIG. 1A is a plan view schematically showing an IDT and a capacitor applied to a SAW filter of the prior art.

FIG. 1B is a cross-sectional view schematically showing a capacitor applied to a SAW filter of the prior art.

FIG. 2A is a plan view schematically showing an IDT and another capacitor applied to a SAW filter of the prior art.

FIG. 2B is a cross-sectional view schematically showing another capacitor applied to a SAW filter of the prior art.

FIG. 3A is a plan view schematically showing an IDT and a capacitor applied to a SAW filter according to an embodiment of the present invention.

FIG. 3B is a cross-sectional view schematically showing a capacitor applied to a SAW filter according to an embodiment of the present invention.

FIG. 4 is a cross-sectional view schematically showing a capacitor applied to a SAW filter according to an embodiment of the present invention.

DETAILED DESCRIPTION OF THE PREFERRED EMBODIMENT

Figure 5:
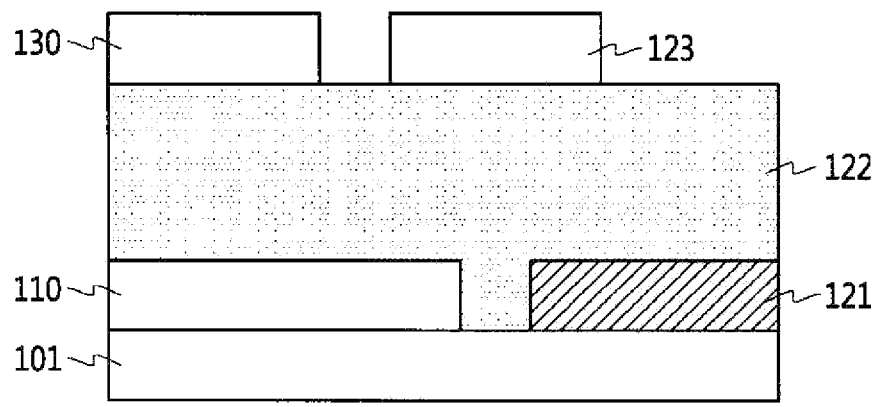
FIG. 5 is a cross-sectional view schematically showing an IDT and another capacitor applied to a SAW filter according to an embodiment of the present invention.

Details of the objects and technical configuration of the present invention described above and operational effects according thereto will be clearly understood hereinafter by the detailed description with reference to the accompanying drawings attached in the specification of the present invention.

In describing the embodiments, the meaning of forming a layer (film), an area, a pattern or a structure "on" or "under" a substrate, a layer (film), an area, a pad or a pattern includes forming directly on the substrate, the layer (film), the area, the pad or the pattern or forming with intervention of another layer. The reference of "on" or "under" of each layer is described based on the drawings.

FIG. 3A is a plan view schematically showing an IDT and a capacitor applied to a SAW filter according to an embodiment of the present invention, and FIG. 3B is a cross-sectional view schematically showing a capacitor applied to a SAW filter according to an embodiment of the present invention. Referring to FIGS. 3A and 3B, a capacitor 120 applied to a SAW filter 100 according to an embodiment of the present invention is roughly formed of a first metal layer 121, an insulation layer 122 and a second metal layer 123, in which the first metal layer 121 becomes a lower electrode and the second metal layer 123 becomes an upper electrode to store electric charge in the insulation layer 122 formed between the first metal layer 121 and the second metal layer 123. The capacitor 120 of the present invention is a capacitor of a Metal Insulator Metal (MIM) form, in which the lower electrode also uses a metallic material to prevent a low dielectric layer from being formed on the lower electrode interface to lower thickness of the silicon dioxide film of the capacitor 120. Although the upper electrode and the lower electrode are formed of poly-crystal silicon (poly-Si) or either the upper electrode or the lower electrode is formed as a metal layer in the prior art, in the present invention, both the upper electrode and the lower electrode are formed as a metal layer.

FIG. 4 is a cross-sectional view schematically showing a capacitor applied to a SAW filter according to an embodiment of the present invention. As shown in FIG. 4, a capacitor 120 according to an embodiment of the present invention includes a first metal layer 121 formed on a substrate 101 to configure an electrode, an insulation layer 122 formed on the first metal layer 121, and a second metal layer 123 formed on the insulation layer 122 to configure another electrode. At this point, the first metal layer 121 is formed of a metal the same as that of an IDT 110 of the SAW filter 100, and the second metal layer 123 is formed of a metal the same as that of a pad 130 (FIG. 5) of the SAW filter 100.

FIG. 5 is a cross-sectional view schematically showing an IDT and another capacitor applied to a SAW filter according to an embodiment of the present invention. A capacitor 120 of the present invention is formed at the same time as an IDT 110 and a pad 130 of the SAW filter are formed. Since a first metal layer 121 of the capacitor 120 is formed at the same time as the IDT 110 of the SAW filter is formed on a substrate 101, the first metal layer 121 of the capacitor 120 can be formed without an additional process.

An insulation layer 122 is formed on the IDT 110 and the first metal layer 121, and the insulation layer 122 at this point simultaneously performs a function of preventing change of frequency caused by thermal expansion of the IDT 110 in the SAW filter 100 and a function of storing electric charge in the capacitor 120.

A second metal layer 123 is formed on the insulation layer 122. The second metal layer 123 is formed at the same time as the pad 130 of the SAW filter is formed. Since the second metal layer 123 is formed at the same time as the pad 130 of the SAW filter is formed, the second metal layer 123 of the capacitor 120 can be formed without an additional process.

The material of the first metal layer 121 is the same as that of the IDT 110. At this point, the IDT 110 and the first metal layer 121 are preferably formed of copper (Cu). The second metal layer 123 is formed of a material the same as that of the pad 130. At this point, the second metal layer 123 and the pad 130 are preferably formed of aluminum (Al) or gold (Au). In addition, although the insulation layer 120 may be formed of a dielectric substance such as $SiO_2$, $SiN_x$, $Al_2O_3$, $Ta_2O_5$ or the like, the insulation layer 120 is preferably formed of $SiO_2$.

The capacitor 120 of the present invention is preferably formed in a SAW filter including the IDT 110 formed on the substrate 101, the insulation layer 122 formed on the IDT 110, and the pad 130 formed on the insulation layer 122. A SAW filter having an insulation layer 122 on an IDT 110 among SAW filters is referred as a Temperature Compensated (TC) SAW filter, and the insulation layer 122 formed in such a Temperature Compensated (TC) SAW filter performs a function of a dielectric substance for storing electric charge of the capacitor 120.

Figure 6:
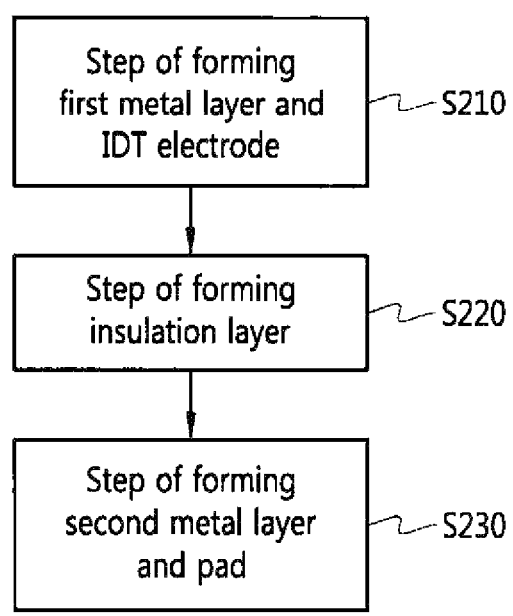
FIG. 6 is a flowchart schematically illustrating a sequence of manufacturing a SAW filter according to an embodiment of the present invention.

FIG. 6 is a flowchart schematically illustrating a sequence of manufacturing a SAW filter according to an embodiment of the present invention. A method of manufacturing a capacitor of a SAW filter, in which two electrodes are formed as metal layers, according to an embodiment of the present invention includes a step of forming an IDT 110 and a first metal layer 121 of the capacitor 120 on a substrate 101 (S210), a step of forming an insulation layer 122 on the IDT 110 and the first metal layer 121 (S220), and a step of forming a pad 130 and a second metal layer 123 on the insulation layer 122 (S230). At this point, the IDT 110 and the first metal layer 121 are preferably formed of copper (Cu), and the pad 130 and the second metal layer 123 are preferably formed of either aluminum (Al) or gold (Au).

The present invention has an effect of improving the low cut-off characteristic of a SAW element.

The present invention has an effect of implementing a capacitor improving the low cut-off characteristic without adding another process to existing processes.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A Surface Acoustic Wave (SAW) filter comprising:
an Inter-Digital Transducer (IDT) formed on a substrate;
a first metal layer formed on the substrate;
an insulation layer formed on the IDT and the first metal layer;
a second metal layer formed on the insulation layer and partially or totally overlapped with the first metal layer; and
a pad for connecting the IDT to outside,
wherein the first metal layer is formed of a same material as the IDT and formed simultaneously with the IDT, and
wherein the second metal layer is formed of a same material as the pad and formed simultaneously with the pad.

2. The SAW filter according to claim 1, wherein the pad is formed on the insulation layer not to be overlapped with the second metal layer.

3. A method of manufacturing a Surface Acoustic Wave (SAW) filter, the method comprising the steps of:
forming an Inter-Digital Transducer (IDT) and a first metal layer of a capacitor on a substrate;
forming an insulation layer on the IDT and the first metal layer; and
forming a pad and a second metal layer on the insulation layer;
wherein the second metal layer is formed to be overlapped partially or totally with the first metal layer,
wherein the IDT and the first metal layer are formed of a same metallic material and formed simultaneously, and
wherein the pad and the second metal layer are formed of a same metallic material and formed simultaneously.

4. The method according to claim 3, wherein the IDT and the first metal layer are formed of copper (Cu).

5. The method according to claim 3, wherein the metallic material forming the pad and the second metal layer is different from the metallic material forming the IDT and the first metal layer.

6. The method according to claim 3, wherein the pad and the second metal layer are formed of aluminum (Al) or gold (Au).

* * * * *